United States Patent
Kimura

(10) Patent No.: US 10,600,752 B2
(45) Date of Patent: Mar. 24, 2020

(54) RESIN-ENCAPSULATED SEMICONDUCTOR DEVICE AND METHOD OF MANUFACTURING THE SAME

(71) Applicant: ABLIC Inc., Chiba-shi, Chiba (JP)

(72) Inventor: Noriyuki Kimura, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 16/507,308

(22) Filed: Jul. 10, 2019

(65) Prior Publication Data
US 2019/0333888 A1 Oct. 31, 2019

Related U.S. Application Data

(62) Division of application No. 15/926,830, filed on Mar. 20, 2018, now Pat. No. 10,354,968.

(30) Foreign Application Priority Data

Mar. 29, 2017 (JP) ................. 2017-065909

(51) Int. Cl.
*H01L 21/56* (2006.01)
*H01L 23/00* (2006.01)
(Continued)

(52) U.S. Cl.
CPC .......... *H01L 24/13* (2013.01); *H01L 21/2885* (2013.01); *H01L 21/31058* (2013.01); *H01L 21/56* (2013.01); *H01L 21/561* (2013.01); *H01L 21/568* (2013.01); *H01L 21/6835* (2013.01); *H01L 21/78* (2013.01); *H01L 23/3114* (2013.01); *H01L 23/3185* (2013.01); *H01L 24/11* (2013.01); *H01L 24/96* (2013.01); *H01L 29/41741* (2013.01); *H01L 21/563* (2013.01); *H01L 2221/68327* (2013.01); *H01L 2224/04105* (2013.01); *H01L 2224/11002* (2013.01); *H01L 2224/11462* (2013.01); *H01L 2224/11464* (2013.01); *H01L 2224/12105* (2013.01); *H01L 2224/13013* (2013.01); *H01L 2224/13016* (2013.01); *H01L 2224/13022* (2013.01); *H01L 2224/13147* (2013.01); *H01L 2224/13583* (2013.01); *H01L 2224/13639* (2013.01);
(Continued)

(58) Field of Classification Search
CPC ..................... H01L 21/563; H01L 23/3185
See application file for complete search history.

(56) References Cited

U.S. PATENT DOCUMENTS 5,723,900 A 3/1998 Kojima
6,486,562 B1 11/2002 Kato ........................ 21/563
(Continued)

FOREIGN PATENT DOCUMENTS

JP 2002368218 12/2002

*Primary Examiner* — George R Fourson, III
(74) *Attorney, Agent, or Firm* — Adams & Wilks

(57) ABSTRACT

A resin-encapsulated semiconductor device includes a bump electrode formed on an element surface side of a semiconductor chip, a conductive layer electrically connected to the bump electrode, and a resin encapsulation body covering the semiconductor chip, the bump electrode, and the conductive layer. On a back surface of the semiconductor chip that is flush with a back surface of the resin encapsulation body, a metal layer and a laminated film are formed. The laminated film is formed on a front surface of the conductive layer, and an external terminal is arranged on an inner side of an outer edge of the semiconductor chip.

8 Claims, 8 Drawing Sheets

(51) Int. Cl.
    *H01L 29/417*    (2006.01)
    *H01L 21/288*    (2006.01)
    *H01L 21/78*     (2006.01)
    *H01L 21/3105*   (2006.01)
    *H01L 23/31*     (2006.01)
    *H01L 21/683*    (2006.01)

(52) U.S. Cl.
    CPC ........... *H01L 2224/13644* (2013.01); *H01L 2224/13655* (2013.01); *H01L 2224/13664* (2013.01); *H01L 2224/13666* (2013.01); *H01L 2224/13671* (2013.01); *H01L 2224/1403* (2013.01); *H01L 2924/13091* (2013.01); *H01L 2924/3511* (2013.01); *H01L 2924/3512* (2013.01); *H01L 2924/37001* (2013.01)

(56) References Cited

U.S. PATENT DOCUMENTS

| | | |
|---|---|---|
| 9,786,588 B2 | 10/2017 | Kung |
| 10,115,651 B2 | 10/2018 | Nishimura |
| 2003/0052405 A1 | 3/2003 | Moriguchi |
| 2007/0075420 A1 | 4/2007 | Lu |
| 2008/0073798 A1 | 3/2008 | Yamano .................... 21/561 |
| 2011/0140254 A1 | 6/2011 | Tsai ......................... 23/495 |
| 2012/0126396 A1 | 5/2012 | Zhao .......................... 23/36 |
| 2013/0234308 A1 | 9/2013 | Yamada ...................... 21/78 |
| 2014/0225239 A1 | 8/2014 | Kimura ...................... 21/568 |
| 2016/0133601 A1 | 5/2016 | Ko ............................. 23/78 |
| 2017/0011980 A1 | 1/2017 | Kim |

RESIN-ENCAPSULATED SEMICONDUCTOR DEVICE AND METHOD OF MANUFACTURING THE SAME

CROSS REFERENCE TO RELATED APPLICATIONS

This application is a division of U.S. application Ser. No. 15/926,830 filed Mar. 20, 2018, which claims the benefit of Japanese Application No. 2017-065909 filed Mar. 29, 2017, which is hereby incorporated by reference, and priority thereto for common subject matter is hereby claimed.

BACKGROUND OF THE INVENTION

1. Field of the Invention

The present invention relates to a structure of a resin-encapsulated semiconductor device and a method of manufacturing the resin-encapsulated semiconductor device.

2. Description of the Related Art

As drive batteries for mobile terminals, for example, smartphones, there is a demand for more compact lithium-ion batteries having a larger capacity. It is accordingly required to reduce the size and weight of a protection circuit configured to manage charging and discharging of the lithium-ion battery. Further, since a power MOSFET that is used in the protection circuit for battery management is connected in series to the lithium-ion battery, minimization of the ON resistance of the power MOSFET reduces the battery loss, with the result that the operating time of the terminal can be lengthened. More compact power MOSFETs having a lower ON resistance are therefore required. As illustrated in FIG. 11, in Japanese Patent Application Laid-open No. 2002-368218, there is proposed a semiconductor device 200 having a flip chip structure in which a semiconductor chip 25 which is a power MOSFET has on its surface a source electrode, a gate electrode, and a drain electrode on which bump electrodes 20, 21, and 22 are formed, respectively, and the semiconductor chip 25 is mounted on a substrate via the bump electrodes. According to the structure disclosed in this invention, it is possible to achieve a small mounting area where the outer edges of the semiconductor device 200 are matched with the outer edges of the semiconductor chip 25, and reduce the ON resistance of the power MOSFET because the bump electrodes are used for wiring instead of bonding wires, leading to a reduction in wiring resistance.

In the case of the semiconductor device having the above-mentioned structure, however, along the progress in thinning of a semiconductor wafer, the warp of the semiconductor wafer increases, with the result that troubles are liable to occur during conveyance. Further, the thinner semiconductor wafer causes quality problems that cracking and chipping of the semiconductor wafer occur in handling so that the production efficiency is significantly deteriorated, resulting in a lower production yield.

In order to solve the above-mentioned quality problems, a production process dedicated for a thinner semiconductor wafer is proposed. This production process that includes bonding a thinner semiconductor wafer to a glass plate for handling, however, requires advanced equipment and more manufacturing steps in production.

SUMMARY OF THE INVENTION

The present invention has been made in view of the circumstances described above, and has an object to provide a resin-encapsulated semiconductor device in which cracking and chipping of a semiconductor wafer is prevented in handling and the production efficiency can be significantly improved without advanced equipment even the thinning of the semiconductor wafer progresses, and also provide a method of manufacturing the resin-encapsulated semiconductor device.

To achieve the object, the present invention employs the following measures.

First, there is provided a resin-encapsulated semiconductor device, including:
- a resin encapsulation body having a first surface and a second surface that is opposite to the first surface;
- a semiconductor chip embedded in the resin encapsulation body, and having an element surface and a back surface that is opposite to the element surface, the back surface being flush with the second surface; and
- an external terminal formed on the element surface of the semiconductor chip, and embedded in the resin encapsulation body;
- a laminated film provided on the external terminal, and being exposed from the first surface; and
- a metal layer formed on the back surface of the semiconductor chip, and protruding from the second surface.

Further, there is provided a method of manufacturing a resin-encapsulated semiconductor device,
the resin-encapsulated semiconductor device including:
- a resin encapsulation body having a first surface and a second surface that is opposite to the first surface;
- a semiconductor chip embedded in the resin encapsulation body; and
- an external terminal formed on an element surface of the semiconductor chip, and embedded in the resin encapsulation body, the method including:
- preparing a substrate having a first main surface and a second main surface that is opposite to the first main surface;
- forming a conductive layer on the first main surface;
- forming the external terminal by connecting a bump electrode formed on the semiconductor chip to the conductive layer;
- forming the resin encapsulation body on the first main surface by covering the external terminal and the semiconductor chip with resin;
- exposing a surface of the semiconductor chip that is opposite to the element surface by grinding the resin encapsulation body and the semiconductor chip from a surface of the resin encapsulation body that is opposite to a surface thereof in contact with the first main surface;
- forming a metal layer on the exposed surface of the semiconductor chip;
- exposing the external terminal and the first surface of the resin encapsulation body; and
- performing singulation by cutting the resin encapsulation body between adjacent semiconductor chips to obtain the resin-encapsulated semiconductor device.

With the use of the above-mentioned measures, cracking and chipping of a thinner semiconductor chip is prevented in handling, and the production efficiency can be significantly improved.

BRIEF DESCRIPTION OF THE DRAWINGS

FIG. 1A is a perspective view of the semiconductor device when seen from the exposed surface side of an external terminal, and FIG. 1B is a perspective view of the semiconductor device when seen from a side of the external terminal that is opposite to the exposed surface.

DESCRIPTION OF THE EMBODIMENTS

Now, a resin-encapsulated semiconductor device and a method of manufacturing the resin-encapsulated semiconductor device according to the present invention are described with reference to the drawings.

Figure 1A:
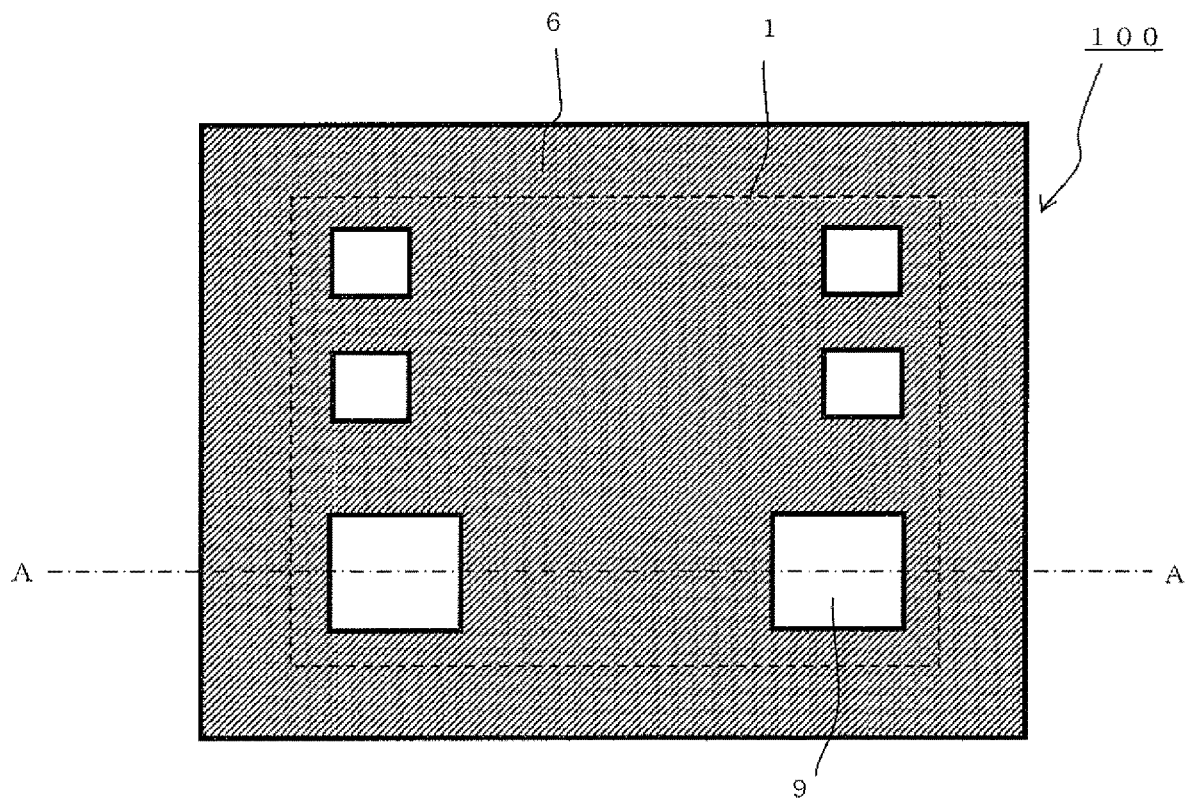
FIG. 1A and FIG. 1B are plan views of a resin-encapsulated semiconductor device according to a first embodiment of the present invention.
Figure 1B:
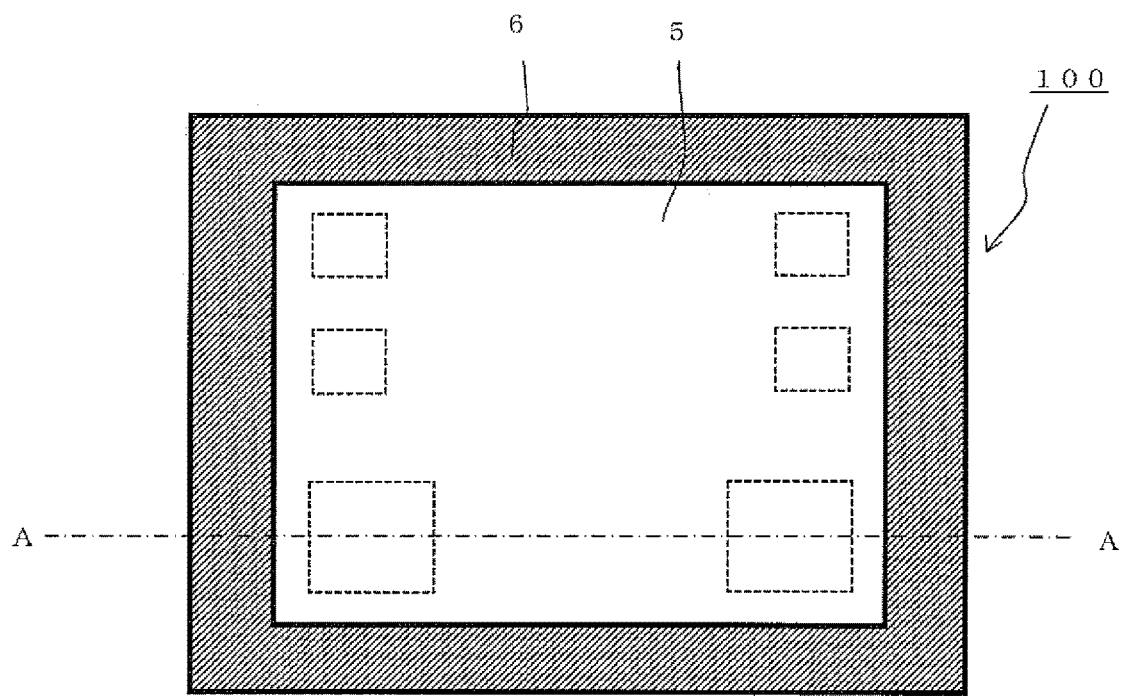

FIG. 1A and FIG. 1B are plan views of a resin-encapsulated semiconductor device according to a first embodiment of the present invention. FIG. 1A is a view of the resin-encapsulated semiconductor device seen from an exposed surface (front surface) of an external terminal, and FIG. 1B is a perspective view of the resin-encapsulated semiconductor device seen from a surface (back surface) of the external terminal that is opposite to the exposed surface.

As illustrated in FIG. 1A, the resin-encapsulated semiconductor device 100 of the first embodiment has six external terminals 9 and includes two power MOSFETs of 6-pin type. The resin-encapsulated semiconductor device 100 includes four source terminals and two gate terminals. The periphery of a semiconductor chip 1 is encapsulated with a resin encapsulation body 6, and the external terminals 9 are exposed from the front surface of the resin encapsulation body 6. Further, as illustrated in FIG. 1B, on the back surface of the semiconductor device 100, a laminated film 5 which is surrounded by the resin encapsulation body 6 is exposed.

Figure 2:
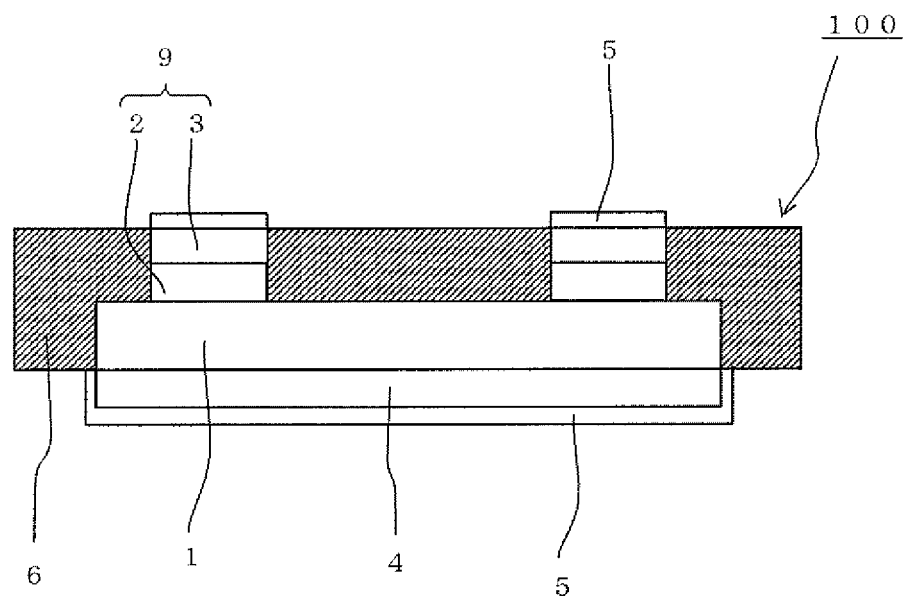
FIG. 2 is a sectional view of the resin-encapsulated semiconductor device according to the first embodiment of the present invention.

FIG. 2 is a sectional view taken along the line A-A of FIG. 1A and FIG. 1B, for illustrating the resin-encapsulated semiconductor device according to the first embodiment of the present invention.

On the front surface of the semiconductor chip 1, bump electrodes 2 are formed at locations corresponding to a plurality of pad electrodes (not shown). A conductive layer 3 is formed on the bump electrode 2. The conductive layer 3 is connected to the bump electrode 2 via solder (not shown) by flip chip bonding. The external terminal 9 which is formed from the semiconductor chip 1, the bump electrode 2, and the conductive layer 3 is encapsulated with the resin encapsulation body 6. The resin encapsulation body 6 has an upper surface and a lower surface. The conductive layer 3, the bump electrode 2, and the semiconductor chip 1 are embedded in the resin encapsulation body 6 in the stated order from the upper surface side, and the semiconductor chip 1 is exposed from the lower surface (back surface) side of the resin encapsulation body 6. The front surface of the conductive layer 3 that is opposite to the surface of the conductive layer 3 in contact with the bump electrode 2 is flush with the upper surface of the resin encapsulation body 6. In addition, the laminated film 5 is formed on the front surface of the conductive layer 3 so as to protrude from the flush surface by its thickness. Here, the external terminals 9 are arranged on the inner side of the outer edges of the semiconductor chip 1 in order that the semiconductor chip 1 serves as an anchor for the external terminal 9 in the resin encapsulation body 6 to prevent easy coming off of the external terminal 9 from the resin encapsulation body 6. Acquisition of the terminal strength of the external terminal 9 in this way also acquires high reliability on the connection between the resin-encapsulated semiconductor device 100 and the assembly board.

The outer edges of the side surfaces of the semiconductor chip 1 are also covered with the resin encapsulation body 6. The resin encapsulation body 6 does not cover the back surface of the semiconductor chip 1, and the lower surface of the resin encapsulation body 6 is flush with the back surface of the semiconductor chip 1. On the back surface of the semiconductor chip 1, a metal layer 4 is formed so as to protrude from the lower surface of the resin encapsulation body 6. The outer edges of the metal layer 4 are matched with the outer edges of the semiconductor chip 1 so that the metal layer 4 and the semiconductor chip 1 have the same size in plan view. In addition, on the metal layer 4, the laminated film 5 is formed to serve as a protective film for the metal layer 4. The metal layer 4 also functions as a common electrode on the drain side of the two power MOSFETs, and thus does not necessarily have the same size as the semiconductor chip 1. It is only required that the metal layer 4 is formed so that the external terminals 9 are located on the inner side of the outer edges of the metal layer 4 when the external terminals 9 are projected on a plane.

Now, the resin-encapsulated semiconductor device according to the first embodiment of the present invention is described in more detail.

The semiconductor chip 1 includes the two power MOSFETs, and has a thickness of 50 µm. On each terminal formed on the element surface side of the semiconductor chip 1, the columnar copper bump electrode 2 having a thickness of 50 µm is formed, and the columnar copper bump electrode 2 having a thickness of 50 µm is connected to the columnar copper conductive layer 3 having a thickness of 50 µm via solder (not shown) by flip chip bonding.

The semiconductor chip 1, the columnar bump electrode 2, the columnar conductive layer 3, and the solder are encapsulated with the epoxy resin encapsulation body 6 except for the front surface of the conductive layer 3 and the back surface of the semiconductor chip 1 which is opposite to that front surface. On the back surface of the semiconductor chip 1 which is exposed from the resin encapsulation body 6 and is opposite to the element surface of the semiconductor chip 1, the copper metal layer 4 having a thickness of 30 μm is formed, and is electrically connected to the semiconductor chip 1. This metal layer 4 functions as the common electrode on the drain side of the two power MOSFETs, and hence is preferably a thick film having a thickness of 30 μm or more, in order to reduce the ON resistance of the power MOSFETs.

The front surface of the metal layer 4 which is exposed from the lower surface of the resin encapsulation body 6 is covered with the laminated film 5. The laminated film 5 is formed on the front surface of the external terminal 9 on the front surface of the semiconductor chip 1, in addition to the back surface of the semiconductor chip 1. The laminated film 5 includes nickel, palladium, and gold layers that are deposited in the stated order from the metal layer 4 side or the external terminal 9 side. The laminated film 5 may be a laminated structure in which chromium, nickel, and gold layers, titanium, nickel, and copper layers, titanium, nickel, and gold layers, or titanium, nickel, and silver layers are deposited in the stated order, instead of the nickel, palladium, and gold layers.

Thinning of the resin-encapsulated semiconductor device 100 according to the first embodiment having the configuration described above can be achieved to have a total thickness of about 0.20 mm. Further, since the semiconductor chip 1, the bump electrode 2, and the conductive layer 3 are encapsulated with the resin encapsulation body 6, the semiconductor chip 1 is protected against external impact, with the result that damage to the semiconductor chip 1 can be prevented in handling for mounting. In addition, since the periphery of the semiconductor chip 1 is supported by the resin encapsulation body 6, warp of the resin-encapsulated semiconductor device 100 is suppressed, improving the handling ability. Besides, since the flatness of the front surface of the resin-encapsulated semiconductor device 100 is maintained, variation in height of the laminated film 5 on the plurality of external terminals 9 is suppressed, enhancing quality of assembling to the assembly board. Moreover, there is provided an effect that a change in semiconductor properties due to the warp can be prevented.

In the above-mentioned structure, though the bump electrode 2, the conductive layer 3, and the laminated film 5 are stacked, the bump electrode 2 may be omitted so that the pad electrode formed in the element surface of the semiconductor chip 1 and the columnar conductive layer 3 may be directly connected to each other by soldering, permitting a thinner resin-encapsulated semiconductor device 100 (a thickness of about 0.15 mm). In this case, it is required that the laminated film 5 including, for example, nickel, palladium, and gold layers is formed on the front surface of each pad electrode formed on the element surface side of the semiconductor chip 1 so that the semiconductor chip 1 can be connected to the conductive layer 3 by soldering.

Figure 3:
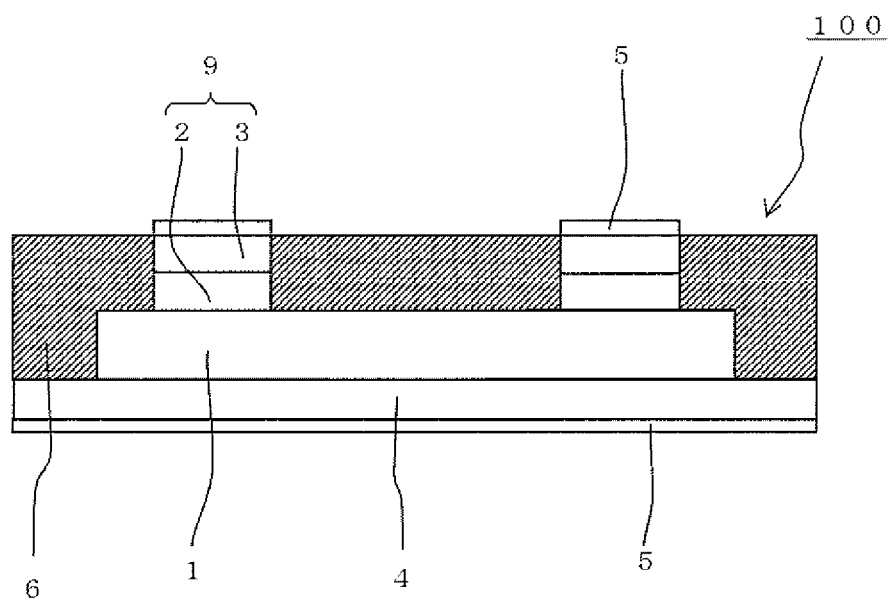
FIG. 3 is a sectional view of a resin-encapsulated semiconductor device according to a second embodiment of the present invention.

FIG. 3 is a sectional view of a resin-encapsulated semiconductor device according to a second embodiment of the present invention.

The resin-encapsulated semiconductor device according to the second embodiment differs from the resin-encapsulated semiconductor device 100 according to the first embodiment of the present invention in that the metal layer 4 and the laminated film 5 are formed on the entire back surface of the resin-encapsulated semiconductor device 100, and that the outer edges of the resin encapsulation body 6 are matched with the outer edges of the metal layer 4 so that the resin encapsulation body 6 and the metal layer 4 have the same size in plan view. It is required to pattern the metal layer 4 into a predetermined shape in the first embodiment, but the configuration of the second embodiment eliminates the need of patterning to provide an effect that the number of processes can be reduced. Further, in the second embodiment, the external terminals 9 are arranged on the inner side of the outer edges of the semiconductor chip 1, and the metal layer 4 extends over the outer edges of the semiconductor chip 1 to be in contact with the back surface of the resin encapsulation body 6. Consequently, in the resin encapsulation body 6, not only the semiconductor chip 1 but also the metal layer 4 serves as an anchor for the external terminal 9 to prevent easy coming off of the external terminal 9 from the resin encapsulation body 6. Acquisition of the terminal strength of the external terminal 9 also acquires high reliability on the connection between the resin-encapsulated semiconductor device 100 and the assembly board.

Figure 4:
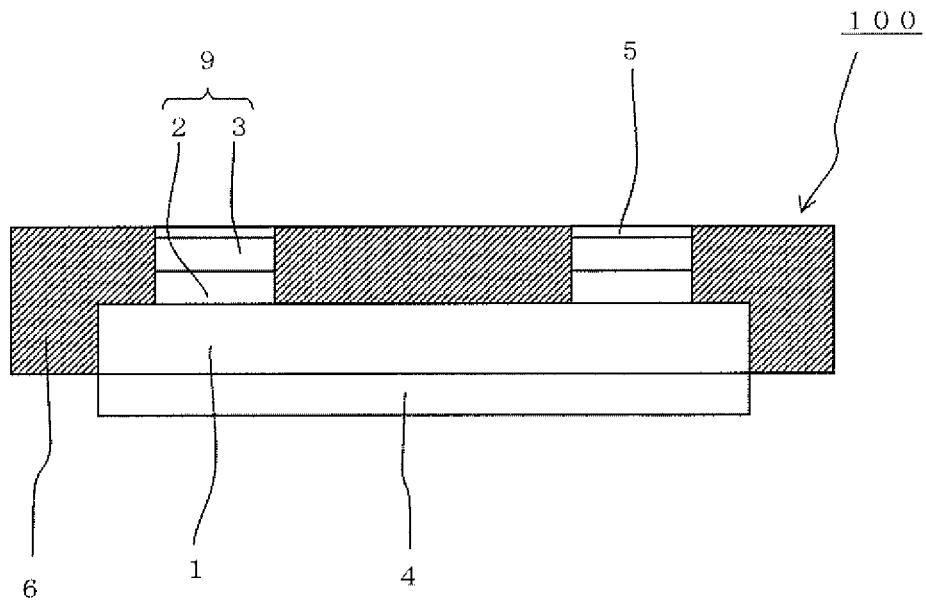
FIG. 4 is a sectional view of a resin-encapsulated semiconductor device according to a third embodiment of the present invention.

FIG. 4 is a sectional view of a resin-encapsulated semiconductor device according to a third embodiment of the present invention.

The resin-encapsulated semiconductor device according to the third embodiment differs from the resin-encapsulated semiconductor device 100 according to the first embodiment of the present invention in that the outer edges of the side surfaces of the laminated film 5 are embedded in the resin encapsulation body 6, that the front surface of the laminated film 5 and the upper surface of the resin encapsulation body 6 form one plane, and that the laminated film 5 is exposed from the plane. With the laminated film 5 embedded in the resin encapsulation body 6 except for the exposed front surface, there is provided an effect that the resin-encapsulated semiconductor device 100 can be mounted on the assembly board with a connecting area that is smaller to some extent than that in the case of the resin-encapsulated semiconductor device 100 according to the first embodiment in which the laminated film 5 protrudes from the resin encapsulation body 6. Further, the front surface of the metal layer 4 which is exposed from the lower surface of the resin encapsulation body 6 is not covered with the laminated film 5 unlike the first embodiment. The laminated film 5 covering the metal layer 4 has a role of the protective film for the metal layer 4. However, no problem arises when this resin-encapsulated semiconductor device 100 is mounted on the assembly board so that the back surface of the metal layer 4 is encapsulated.

Figure 5:
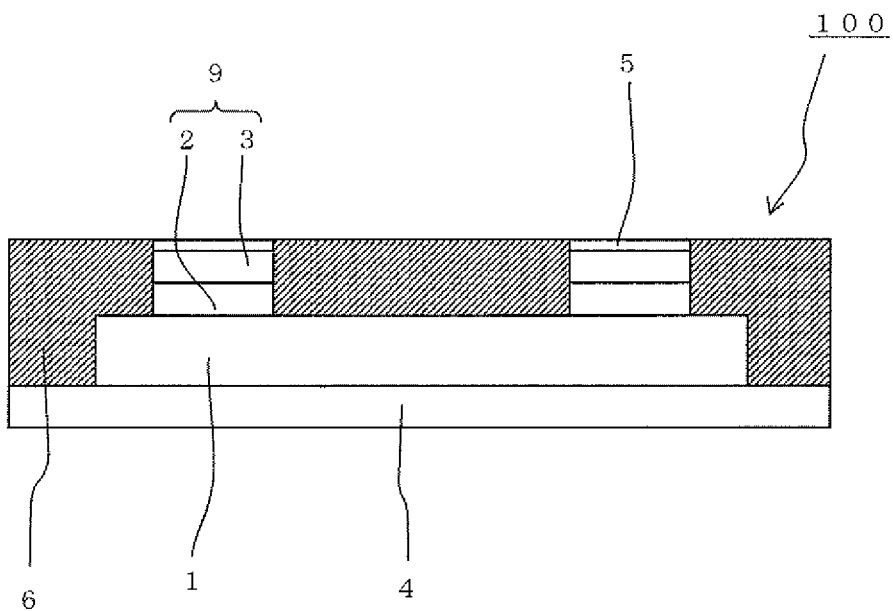
FIG. 5 is a sectional view of a resin-encapsulated semiconductor device according to a fourth embodiment of the present invention.

FIG. 5 is a sectional view of a resin-encapsulated semiconductor device according to a fourth embodiment of the present invention.

The resin-encapsulated semiconductor device according to the fourth embodiment differs from the resin-encapsulated semiconductor device 100 according to the second embodiment of the present invention in that the outer edges of the side surfaces of the laminated film 5 are embedded in the resin encapsulation body 6, that the front surface of the laminated film 5 and the upper surface of the resin encapsulation body 6 form one plane, and that the laminated film 5 is exposed from the plane. With the laminated film 5 embedded in the resin encapsulation body 6 except for the exposed front surface, there is provided an effect that the resin-encapsulated semiconductor device 100 can be mounted on the assembly board with a connecting area that is smaller to some extent than that in the case of the resin-encapsulated semiconductor device 100 according to the first embodiment in which the laminated film 5 protrudes from the resin encapsulation body 6. Further, the front surface of the metal layer 4 which protrudes from the lower surface of the resin encapsulation body 6 is not covered with the laminated film 5 unlike the second embodiment. The laminated film 5 covering the metal layer 4 has a role of the protective film for the metal layer 9. However, no problem arises when this resin-encapsulated semiconductor device 100 is mounted on the assembly board so that the back surface of the metal layer 4 is encapsulated.

Figure 6:
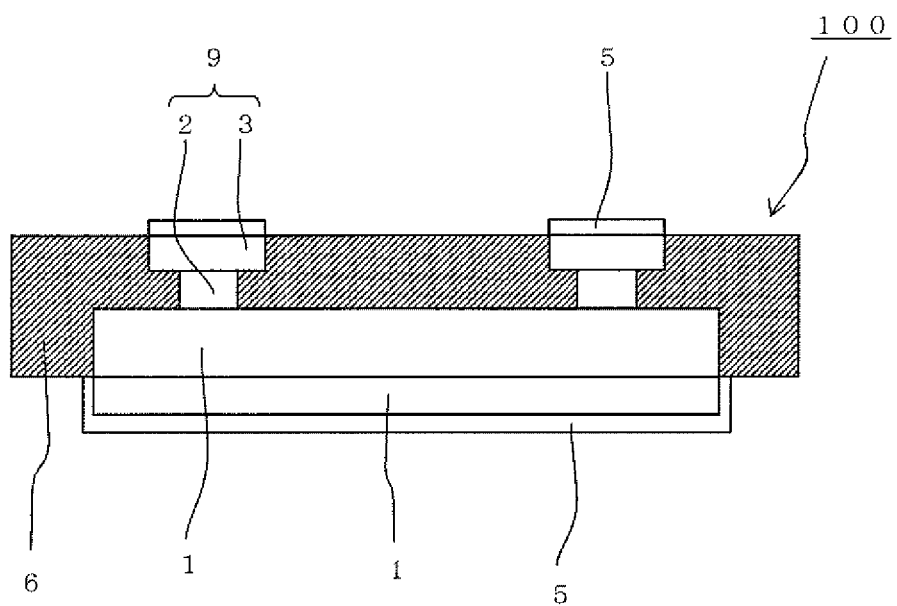
FIG. 6 is a sectional view of a resin-encapsulated semiconductor device according to a fifth embodiment of the present invention.

FIG. 6 is a sectional view of a resin-encapsulated semiconductor device according to a fifth embodiment of the present invention.

The resin-encapsulated semiconductor device according to the fifth embodiment differs from the resin-encapsulated semiconductor device 100 according to the first embodiment of the present invention in that the bump electrode 2 and the conductive layer 3 have different diameters. In FIG. 2, the bump electrode 2, the conductive layer 3, and the laminated film 5 have the same diameter and are superimposed on one another in plan view. In the structure of the fifth embodiment, however, the bump electrode 2 has an outer diameter that is smaller than the outer diameter of the conductive layer 3. In the first embodiment, the external terminals 9 are arranged on the inner side of the outer periphery of the semiconductor chip 1 so that the semiconductor chip 1 serves as the anchor for the external terminal 9 in the resin encapsulation body 6 to prevent easy coming off of the external terminal 9 from the resin encapsulation body 6 in the upward direction of the drawing sheet. Meanwhile, in the fifth embodiment, since the bump electrode 2 and the conductive layer 3 are partially superimposed on each other in plan view, and the bump electrode 2 has a sectional area (outer diameter) that is smaller than the sectional area (outer diameter) of the conductive layer 3, easy coming off of the external terminal 9 from the resin encapsulation body 6 is prevented in the downward direction of the drawing sheet. Consequently, the contact between the resin encapsulation body 6 and the bump electrode 2 and the conductive layer 3 of the semiconductor chip 1 is strong. Since the semiconductor chip 1 is satisfactorily supported by the resin encapsulation body 6, warp of the resin-encapsulated semiconductor device 100 is suppressed, improving the handling ability. Besides, since the flatness of the front surface of the resin-encapsulated semiconductor device 100 is maintained, the height uniformity (coplanarity) of the laminated film 5 formed on the plurality of external terminals 9 is improved, enhancing quality of assembling to the assembly board.

FIG. 7A to FIG. 9B are sectional views of a process flow, for illustrating a method of manufacturing the resin-encapsulated semiconductor device according to the first embodiment of the present invention.

Figure 7A:
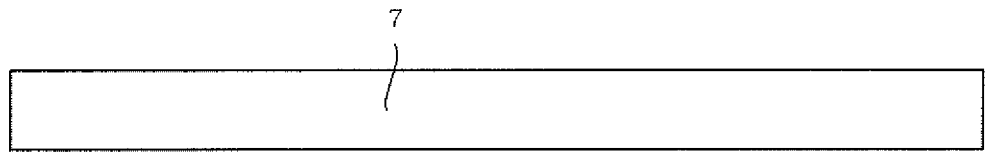
FIG. 7A, FIG. 7B, FIG. 7C, and FIG. 7D are sectional views of a process flow, for illustrating a method of manufacturing the resin-encapsulated semiconductor device according to the first embodiment of the present invention.
Figure 7B:
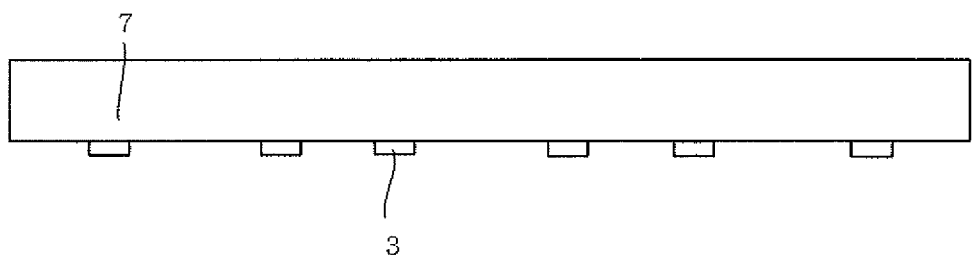

As illustrated in FIG. 7A, a substrate 7 is first prepared. The substrate 7 is an iron-based steel plate having a length of 250 mm, a width of 80 mm, and a thickness of 250 μm. Examples of other substrate materials may include a copper-based alloy material, a nickel-based alloy material, and a ceramics or fiber-reinforced plastic (FRP) plate which is an insulating member. As illustrated in FIG. 7B, on one of the main surfaces of the substrate 7, the columnar copper conductive layer 3 having a thickness of 50 μm is formed by electrolytic plating or electroless plating. The material of the conductive layer 3 is a single layer material of solder, gold, silver, copper, aluminum, palladium, or nickel, a multilayer material including layers of those metals, or an alloy of those metals.

Figure 7C:
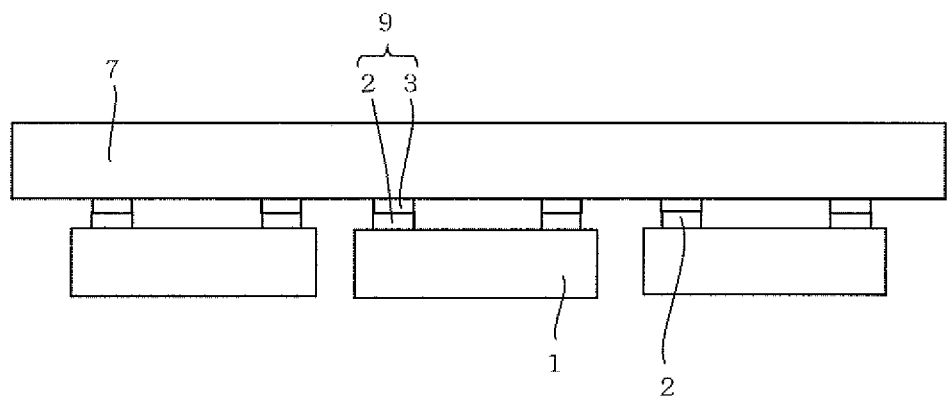
Figure 7D:
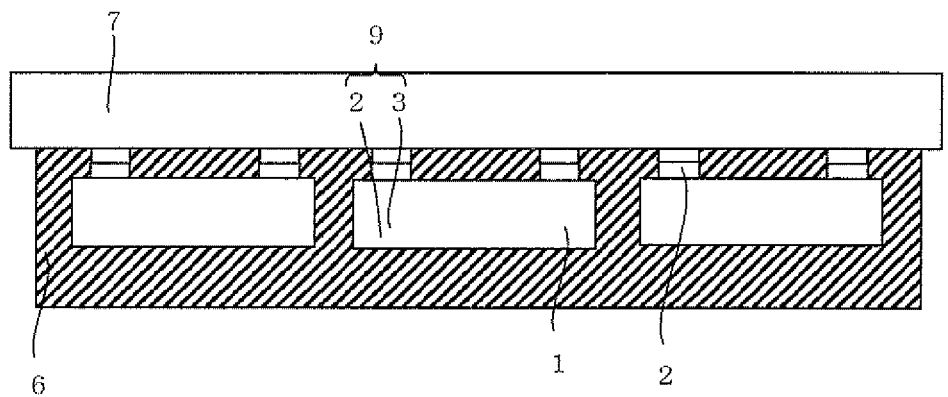

Subsequently, as illustrated in FIG. 7C, the columnar copper bump electrode 2 having a thickness of 50 μm is formed on the terminal on the element surface side of the semiconductor chip 1 by electrolytic plating, and the bump electrode 2 is connected to the conductive layer 3 which is formed on the substrate 7 via solder by flip chip bonding. In this way, the external terminal 9 is formed. The semiconductor chip 1 has a thickness that is the sum of the thickness of a semiconductor wafer based on one of the respective standards (for example, 6 inches: 675 μm in JEITA standards, 6 inches: 625 μm in SEMI standards, 8 inches: 725 μm in JEITA standards, and 8 inches: 725 μm in SEMI standards), the thicknesses of an insulating film, a conductive film, and other films after repetitive film formation, etching and so on, and the thickness of the bump electrode 2 which is 50 μm. Next, as illustrated in FIG. 7D, the one of the main surface sides of the substrate 7 is encapsulated with the resin encapsulation body 6 so that the resin encapsulation body 6 completely covers the semiconductor chip 1, the bump electrode 2, the conductive layer 3, and the solder. At this time, it is preferred that the resin encapsulation body 6 has a lower surface that is as flat as possible, and be filled between adjacent semiconductor chips 1 and between the semiconductor chip 1 and the substrate 7 without any gaps. It is only required that a thickness from the back surface of the semiconductor chip 1 to the bottom portion of the resin encapsulation body 6 is 50 μm or more. When the semiconductor wafer having a thickness of 675 μm in JEITA standards is used, the total thickness of the resin encapsulation body 6 at this point is about 850 μm or more. Encapsulation with the resin encapsulation body 6 is performed using transfer molding. The resin encapsulation body 6 is a thermosetting epoxy resin containing a light-shielding component and filler which is generally used for encapsulation of the semiconductor chip 1.

Figure 8A:
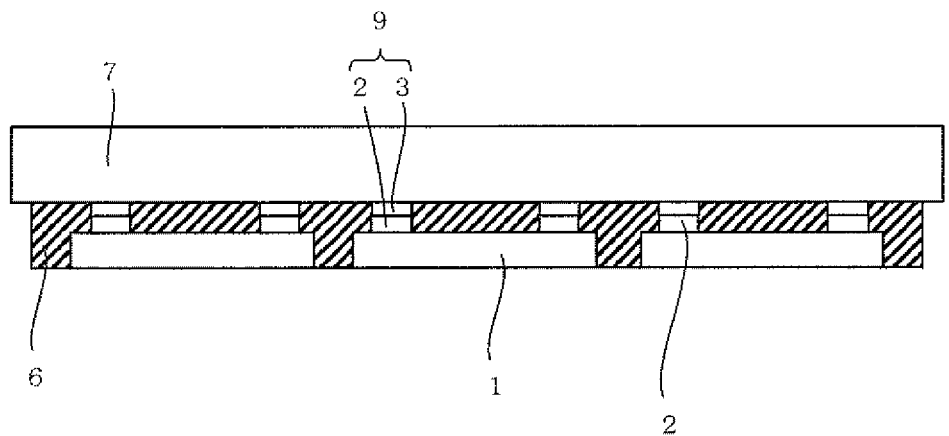
FIG. 8A, FIG. 8B, and FIG. 8C are sectional views of the process flow following to FIG. 7D, for illustrating the method of manufacturing the resin-encapsulated semiconductor device according to the first embodiment of the present invention.
Figure 8B:
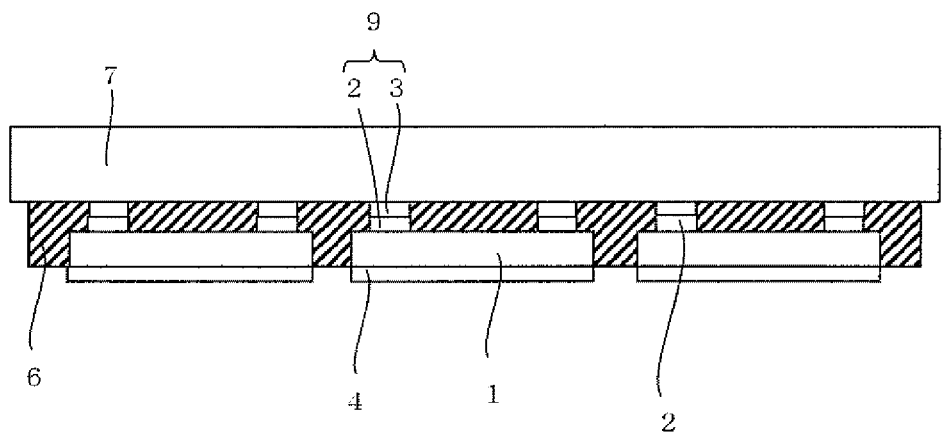
Figure 8C:
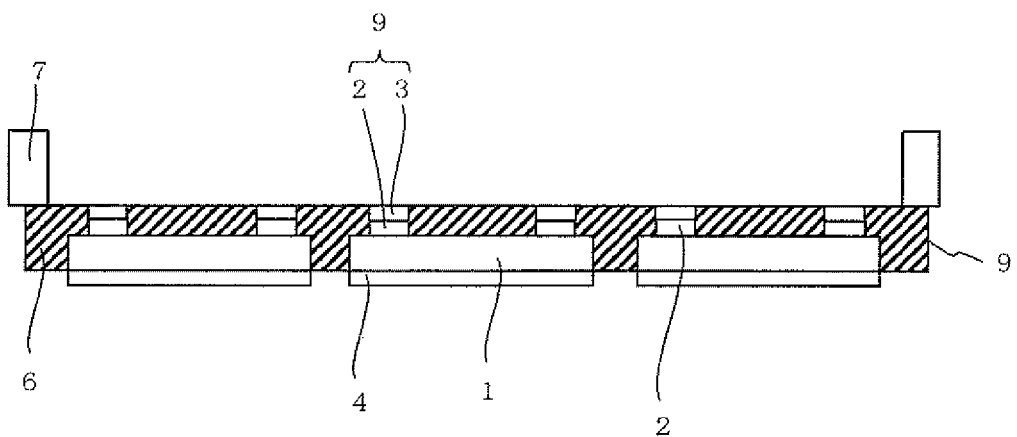

Next, as illustrated in FIG. 8A, the resin encapsulation body 6 is ground and polished from its lower surface side so that the surface of the semiconductor chip 1 that is opposite to the element side is exposed. In the first embodiment, the resin encapsulation body 6 is first ground by backgrinding, and is then subjected to chemical mechanical polishing (CMP) for finishing so that the semiconductor chip 1 has a thickness of 50 μm. There is, however, a method in which grinding and polishing are performed while only the yarn count of a grinding-stone used in backgrinding is changed without using CMP. According to this method, the amount of processing of grinding and polishing can be adjusted depending on required specifications of a product to change the thickness of the semiconductor chip 1. Next, as illustrated in FIG. 8B, on the exposed surface of the semiconductor chip 1 that is opposite to the element surface, that is, the back surface of the semiconductor chip 1, the metal layer 4 having a thickness of 30 μm is formed by copper plating. Next, as illustrated in FIG. 8C, an opening is formed in the substrate 7 by, for example, etching the substrate 7 except for its outer peripheral portions from the other main surface which is opposite to the one main surface to thereby expose the front surface of the external terminal 9, that is, the surface of the conductive layer 3 that is opposite to the surface connected to the bump electrode 2. At this time, the lower surfaces of the outer peripheral portions of the substrate 7 are connected to the resin encapsulation body 6 and remain in an outer frame-like shape. The outer peripheral portions serve as a reinforcement frame for the structural components such as the semiconductor chip 1, the resin encapsulation body 6, and the external terminal 9. The remained outer peripheral portions facilitate handling of the structural components in the subsequent processes. When the outer frame alone does not reinforce the structural components sufficiently, the substrate 7 may also remain between the adjacent semiconductor chips 1. When the structural components have sufficient strength without the outer peripheral portions, however, the substrate 7 may be completely etched so that the outer peripheral portions do not remain. The etching may be wet etching or dry etching. Etching using etchant with selectivity to the material of the substrate 7 eliminates the need of mask formation, and is thus efficient.

Figure 9A:
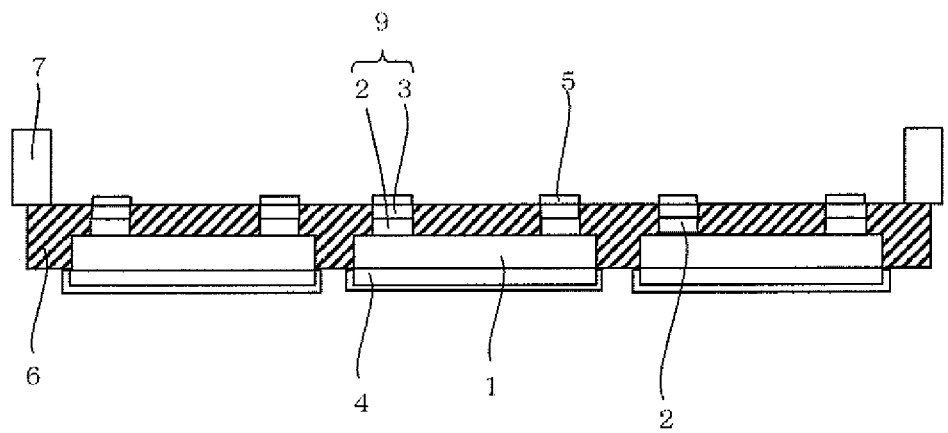
FIG. 9A and FIG. 9B are sectional views of the process flow following to FIG. 8C, for illustrating the method of manufacturing the resin-encapsulated semiconductor device according to the first embodiment of the present invention.

Next, as illustrated in FIG. 9A, on the front surface of the external terminal 9 and the front surface of the metal layer which are exposed from the resin encapsulation body 6, the laminated film 5 which includes nickel, palladium, and gold layers that are laminated in the stated order is formed. The laminated film 5 may include, instead of the nickel, palladium, and gold layers, chromium, nickel, and gold layers, titanium, nickel, and copper layers, titanium, nickel, and gold layers, or titanium, nickel, and silver layers that are deposited in the stated order. Other various metal materials can be used, and the laminated film 5 is a film including a plurality of laminated layers made of metals selected from solder, gold, silver, copper, aluminum, palladium, nickel, titanium, and chromium. The laminated film 5 formed on the external terminal 9 allows the resin-encapsulated semiconductor device 100 to be connected to the assembly board with excellent wettability when the resin-encapsulated semiconductor device 100 is mounted thereon. Further, the laminated film 5 formed on the metal layer 4 protects the metal layer 4.

Figure 9B:
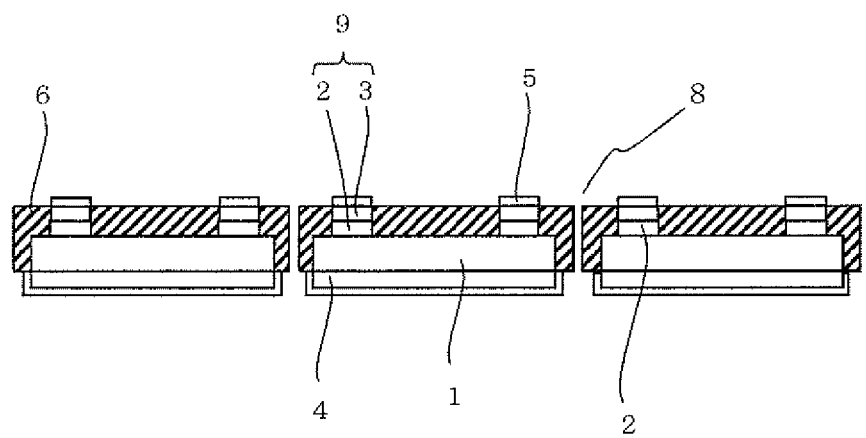

Finally, as illustrated in FIG. 9B, the resin encapsulation body 6 formed between the adjacent semiconductor chips 1 is cut by blade dicing. In this way, the individual singulated resin-encapsulated semiconductor devices 100 are complete. At this time, the resin encapsulation body 6 formed between the semiconductor chip 1 near the end portions of the substrate 7 and the remained outer peripheral portions of the substrate 7 is also cut to cut off the outer peripheral portions. Further, breaking or laser cutting may be performed instead of blade dicing. The cutting width of a dicing area 8 is very narrow, specifically, several micrometers to several tens of micrometers, although the cutting width depends on a singulation method. This means that a large number of semiconductor chips can be imposed per substrate 7, and the resin-encapsulated semiconductor device 100 can therefore be obtained with a high yield.

Figure 10:
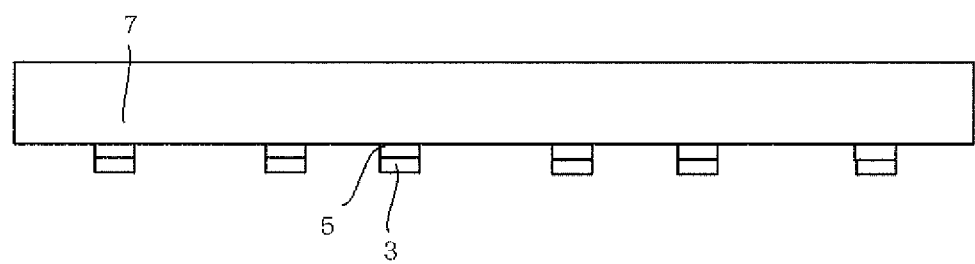
FIG. 10 is a sectional view of a process flow, for illustrating one process in a method of manufacturing the resin-encapsulated semiconductor device according to the third embodiment of the present invention.
Figure 11:
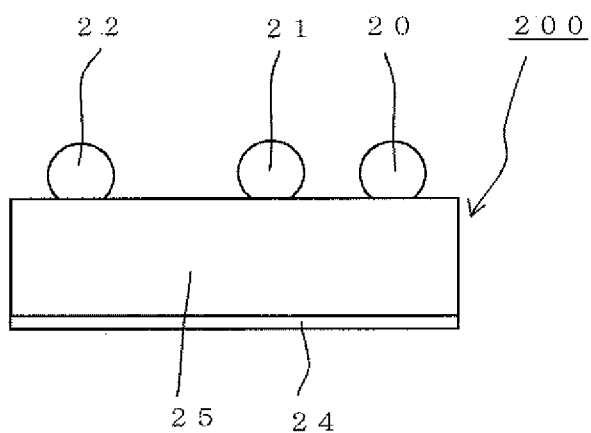
FIG. 11 is a sectional view of a related-art resin-encapsulated semiconductor device.

FIG. 10 is a sectional view of a process flow, for illustrating one process in a method of manufacturing the resin-encapsulated semiconductor device according to the third embodiment of the present invention.

In the resin-encapsulated semiconductor devices 100 illustrated in FIG. 4 and FIG. 5, the laminated film 5 formed on the external terminal 9 is embedded in the resin encapsulation body 6, and only the front surface of the laminated film 5 is exposed to be flush with the front surface of the resin encapsulation body 6. Such resin-encapsulated semiconductor devices 100 may be manufactured by a method including a process illustrated in FIG. 10 instead of the process illustrated in FIG. 7B. On one of the main surfaces of the substrate 7, the laminated film 5 and the columnar conductive layer 3 are formed in succession by electrolytic plating or electroless plating. In this way, there can be manufactured a resin-encapsulated semiconductor device in which the laminated film 5 formed on the external terminal 9 is embedded in the resin encapsulation body 6, as in the resin-encapsulated semiconductor devices 100 illustrated in FIG. 4 and FIG. 5. With this method, the process illustrated in FIG. 9A can be omitted. The same holds true for a method of manufacturing the resin-encapsulated semiconductor device according to the fourth embodiment of the present invention.

In the resin-encapsulated semiconductor devices 100 of the present invention described above, since the semiconductor chip 1 is covered with the resin encapsulation body 6, the semiconductor chip 1 does not warp and the semiconductor properties do not change due to the warp. Further, the semiconductor chip 1 is covered with the protective layer, specifically, the resin encapsulation body 6, and is thus resistant to mechanical impact. Consequently, cracking and chipping of the semiconductor chip 1 is prevented in handling, and the production efficiency can be significantly improved. Further, the methods of manufacturing the resin-encapsulated semiconductor device 100 of the present invention include the processes of connecting the semiconductor chip 1 having a large thickness to the substrate 7, and thinning the semiconductor chip 1 after covering the semiconductor chip I with the resin encapsulation body 6. That is, the methods do not include a process of handling the thinned semiconductor chip 1 itself, and hence a problem of cracking or chipping of the semiconductor chip 1 does not arise.

As described above, with the resin-encapsulated semiconductor device and the method of manufacturing the resin-encapsulated semiconductor device of the present invention, cracking and chipping of the thinner semiconductor chip 1 is prevented in handling, and the production efficiency can be significantly improved.

What is claimed is:
1. A method of manufacturing a resin-encapsulated semiconductor device,
   the resin-encapsulated semiconductor device including:
      a resin encapsulation body having a first surface and a second surface that is opposite to the first surface;
      a semiconductor chip embedded in the resin encapsulation body; and
      an external terminal formed on an element surface of the semiconductor chip, and embedded in the resin encapsulation body,
   the method comprising:
      preparing a substrate having a first main surface and a second main surface that is opposite to the first main surface;
      forming a conductive layer on the first main surface;
      forming the external terminal by connecting a bump electrode formed on the semiconductor chip to the conductive layer;
      forming the resin encapsulation body on the first main surface by covering the external terminal and the semiconductor chip with resin;
      exposing a surface of the semiconductor chip that is opposite to the element surface by grinding the resin encapsulation body and the semiconductor chip from a surface of the resin encapsulation body that is opposite to a surface thereof in contact with the first main surface;
      forming a metal layer on the exposed surface of the semiconductor chip;
      exposing the external terminal and the first surface of the resin encapsulation body; and
      performing singulation by cutting the resin encapsulation body between adjacent semiconductor chips to obtain the resin-encapsulated semiconductor device.

2. The method of manufacturing a resin-encapsulated semiconductor device according to claim 1, wherein the forming a metal layer includes forming the metal layer that has an outer edge that is matched with an outer edge of the semiconductor chip so that the metal layer and the semiconductor chip have the same size in plan view.

3. The method of manufacturing a resin-encapsulated semiconductor device according to claim 1, wherein the forming a metal layer includes forming the metal layer that has an outer edge that is matched with an outer edge of the resin encapsulation body so that the metal layer and the resin encapsulation body have the same size in plan view.

4. The method of manufacturing a resin-encapsulated semiconductor device according to claim 1, wherein the exposing a surface of the semiconductor chip that is opposite to the element surface includes performing chemical mechanical polishing (CMP) treatment after grinding the resin encapsulation body and the semiconductor chip.

5. The method of manufacturing a resin-encapsulated semiconductor device according to claim 1, wherein the performing singulation by cutting the resin encapsulation body between adjacent semiconductor chips to obtain the resin-encapsulated semiconductor device includes performing one of dicing and breaking.

6. The method of manufacturing a resin-encapsulated semiconductor device according to claim 1, wherein the exposing the external terminal and the first surface of the resin encapsulation body includes completely removing the substrate.

7. The method of manufacturing a resin-encapsulated semiconductor device according to claim 1, wherein the exposing the external terminal and the first surface of the resin encapsulation body includes partially removing the substrate.

8. The method of manufacturing a resin-encapsulated semiconductor device according to claim 7, wherein the exposing the external terminal and the first surface of the resin encapsulation body includes forming an opening in the substrate except for an outer peripheral portion of the substrate.

* * * * *